United States Patent
Okabayashi et al.

(10) Patent No.: US 6,928,575 B2
(45) Date of Patent: Aug. 9, 2005

(54) APPARATUS FOR CONTROLLING AND SUPPLYING IN PHASE CLOCK SIGNALS TO COMPONENTS OF AN INTEGRATED CIRCUIT WITH A MULTIPROCESSOR ARCHITECTURE

(75) Inventors: Kazuhiro Okabayashi, Osaka (JP); Minoru Okamoto, Osaka (JP); Shinichi Marui, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 478 days.

(21) Appl. No.: 09/973,888

(22) Filed: Oct. 11, 2001

(65) Prior Publication Data

US 2002/0046356 A1 Apr. 18, 2002

(30) Foreign Application Priority Data

Oct. 12, 2000  (JP) ...................................... 2000-311580

(51) Int. Cl.[7] .............................................. G06F 1/12
(52) U.S. Cl. ....................................... 713/503; 713/500
(58) Field of Search ................................. 713/500, 501, 713/503, 1, 2, 300, 320, 322, 324

(56) References Cited

U.S. PATENT DOCUMENTS 4,368,514 A      1/1983  Persaud et al.
5,631,591 A  *   5/1997  Bar-Niv ....................... 327/158
5,903,503 A  *   5/1999  Yamauchi et al. ........... 365/203
5,991,819 A  *  11/1999  Young ........................ 709/253
6,289,436 B1 *   9/2001  Terashima .................... 712/36
6,631,474 B1 *  10/2003  Cai et al. ..................... 713/300

FOREIGN PATENT DOCUMENTS

| JP | 62-24356 A | 2/1987 |
| JP | 5-257907 A | 10/1993 |
| JP | 6-187066 A | 7/1994 |
| JP | 8-234861 A | 9/1996 |
| JP | 10-161769 | 6/1998 |
| JP | 2000-66776 A | 3/2000 |

* cited by examiner

Primary Examiner—Lynne H. Browne
Assistant Examiner—Paul Yanchus, III
(74) Attorney, Agent, or Firm—McDermott Will & Emery LLP

(57) ABSTRACT

A first processor, a second processor, a memory and a clock supply unit are integrated together on a single chip. The first processor operates synchronously with a first internal clock signal. The second processor operates synchronously with a second internal clock signal. The memory operates synchronously with a third internal clock signal. The clock supply unit generates three clock signals, which are in phase with each other, from an external clock signal and supplies those clock signals as the first, second and third internal clock signals. The first and second processors share the memory via a data bus. Each of the processors has an internal reset signal.

3 Claims, 11 Drawing Sheets

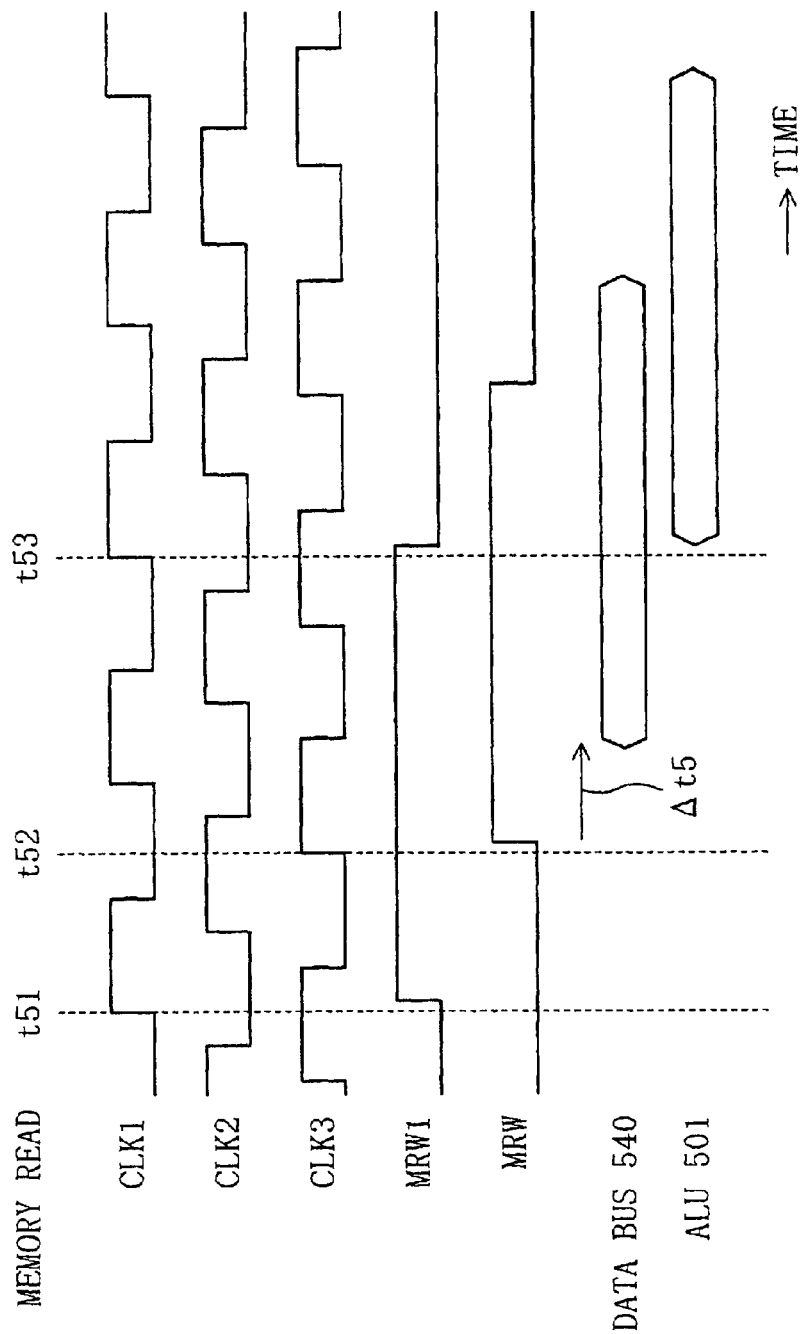

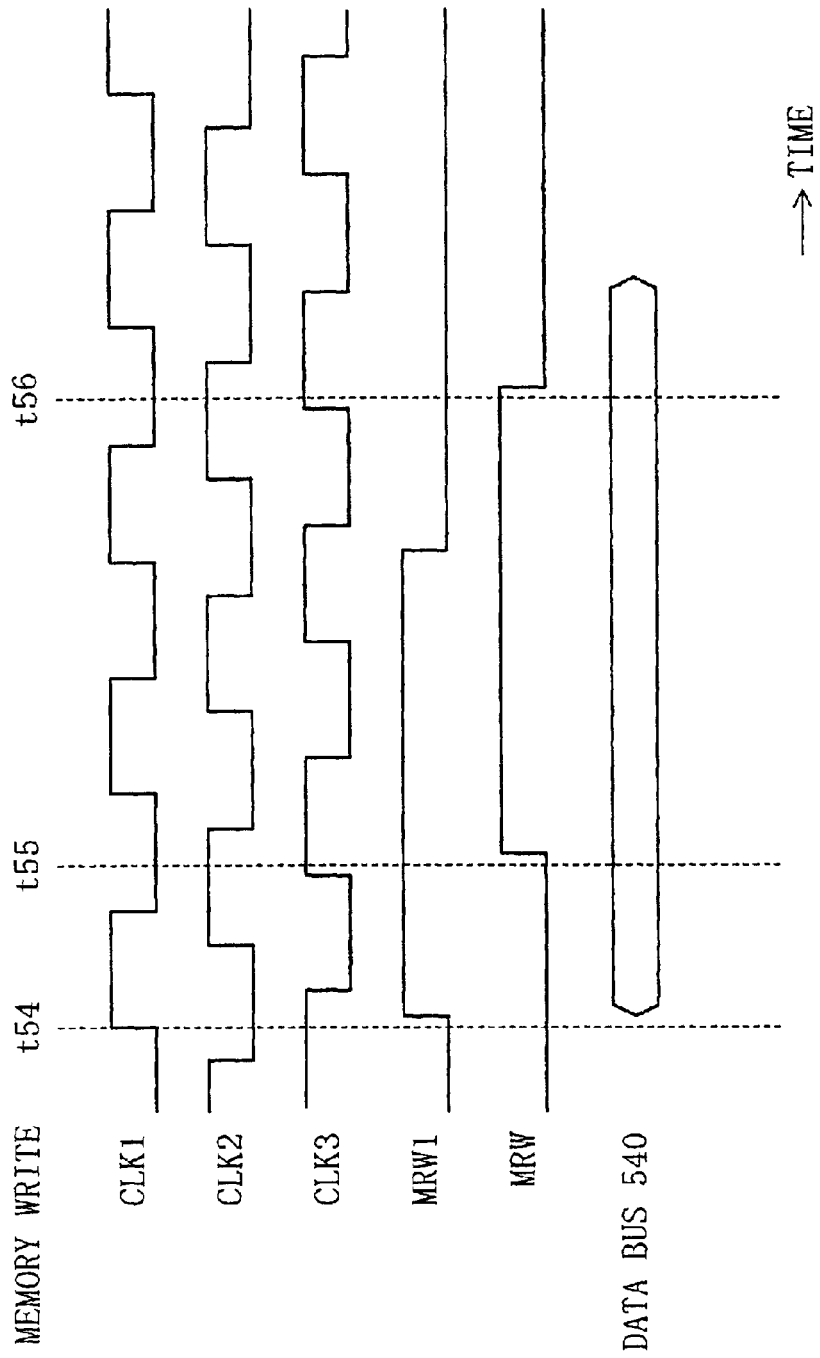

APPARATUS FOR CONTROLLING AND SUPPLYING IN PHASE CLOCK SIGNALS TO COMPONENTS OF AN INTEGRATED CIRCUIT WITH A MULTIPROCESSOR ARCHITECTURE

BACKGROUND OF THE INVENTION

The present invention relates to an integrated circuit with multiprocessor architecture.

Microprocessors and DSPs (digital signal processors) are being widely used in many applications. Particularly, in the field of mobile communications under the recent remarkable development, the information processability required is now several times as high as that of a known single processor and thus an architecture in which multiple processors share a memory, or a so-called multiprocessor architecture, has been widely adopted. On the other hand, as the design rule has been reduced, an LSI (large-scale integrated circuit) including multiple processors and a memory that are integrated on a single chip, is now implementable.

FIG. 10 illustrates an example of a known multiprocessor structure. In this example, a first processor 500 and a second processor 510 both access a memory 520 through a memory controller 530 to carry out processing. The first processor 500 includes arithmetic and logic unit (ALU) 501, address output unit 502, clock supply unit 503 and reset control unit 504. Similarly, the second processor 510 includes arithmetic and logic unit (ALU) 511, address output unit 512, clock supply unit 513 and reset control unit 514. The first and second processors 500 and 510 are coupled to the memory 520 through a data bus 540.

In this LSI, first, second and third reset signals RST1, RST2 and RST3 are asserted first, thereby resetting the first and second processors 500 and 510 and memory controller 530, respectively. In the first processor 500, when RST1 is asserted, the reset control unit 504 resets the units 501, 502 and 503 shown in FIG. 10 and units such as one (not shown) in charge of execution and control of instructions, for example. In the second processor 510, when RST2 is asserted, a similar reset operation is performed. The memory controller 530 is reset by RST3. A first clock signal CLK1 is supplied to the first processor 500. A second clock signal CLK2 is supplied to the second processor 510. A third clock signal CLK3 is supplied to the memory 520 and memory controller 530.

Next, when RST1, RST2 and RST3 are negated, the first and second processors 500 and 510, memory 520 and memory controller 530 start their predetermined operations. In this case, the first processor 500 operates synchronously with CLK1. The second processor 510 operates synchronously with CLK2. The memory 520 and memory controller 530 operate synchronously with CLK3. However, CLK1, CLK2 and CLK3 are out of phase with each other. Thus, the first and second processors 500 and 510, memory 520 and memory controller 530 operate asynchronously with each other.

Hereinafter, it will be described how the first processor 500 accesses the memory 520 after the reset operation has been performed.

FIG. 11 is a timing diagram illustrating a case where the first processor 500 reads data from the memory 520. The processor 500 synchronizes with CLK1, and at a time t51, asserts a memory access signal MRW1 so as to indicate a readstate and outputs an address ADRS1. Since MRW1 is asserted, the memory controller 530 selects ADRS1 as an address ADRS to be provided to the memory 520. However, MRW1 and ADRS1 are not synchronized with CLK3. Thus, the memory controller 530 provides a memory access signal MRW and an address ADRS that are synchronized with CLK3, to the memory 520 at a time t52. The memory 520 outputs data to the data bus 540 after a memory access time Δt5 has passed. The arithmetic and logic unit 501 of the processor 500 synchronizes with CLK1 and receives the data from the data bus 540 at a time t53.

FIG. 12 is a timing diagram illustrating a case where the processor 500 writes data on the memory 520. The processor 500 synchronizes with CLK1, and at a time t54, asserts MRW1 so as to indicate a write-state and outputs ADRS1 and data to the memory controller 530 and the data bus 540, respectively. Since MRW1 is asserted, the memory controller 530 selects ADRS1 as an address ADRS to be provided to the memory 520. However, MRW1 and ADRS1 are not synchronized with CLK3. Thus, the memory controller 530 provides MRW and ADRS which are synchronized with CLK3, to the memory 520 at a time t55. The memory 520 receives the data from the data bus 540 at a time t56.

Where the second processor 510 reads or writes data from/on the memory 520, a memory access signal MRW2 output from the second processor 510 is asserted. The memory controller 530 then selects an address ADRS2 supplied from the second processor 510 as an address ADRS to be provided to the memory 520. In the other respects, the same operations are performed.

However, in the known structure, data are not transferred at a high speed between the first or second processor 500 or 510 and the memory 520 due to the phase differences among CLK1, CLK2 and CLK3. For example, to access the memory 520, the first processor 500 needs two cycles of CLK1 (from the time t51 to the time t53) in the memory read transaction shown in FIG. 11 and about three cycles of CLK1 (from the time t54 to the time t56) in the memory write transaction shown in FIG. 12.

In addition, the first processor 500 includes the clock supply unit 503 and reset control unit 504 and the second processor 510 also includes the clock supply unit 513 and reset control unit 514. Thus, where the processors are integrated on a single chip, the total chip area increases.

Further, RST1, RST2 and RST3 have to be asserted or negated synchronously with CLK1, CLK2 and CLK3, respectively. Thus, it has been difficult to design the input timing of the reset signals.

SUMMARY OF THE INVENTION

A main object of the present invention is to speed up memory access performed by each processor in an integrated circuit with a multiprocessor architecture including a built-in memory.

To achieve the object, the present invention has adopted a configuration in which a first processor, a second processor, a memory and a clock supply unit are integrated together on a single chip. The first processor operates synchronously with a first internal clock signal. The second processor operates synchronously with a second internal clock signal. The memory operates synchronously with a third internal clock signal. The clock supply unit generates three clock signals, which are in phase with each other, from an external clock signal and supplies those clock signals as the first, second and third internal clock signals.

This is to say, phase locking has been accomplished among the three internal clock signals so that the first and second processors, and the memory can operate synchronously with each other, thus allowing each of the processor to access the memory at a high speed. As a result, the integrated circuit can have its information processability increased drastically.

BRIEF DESCRIPTION OF THE DRAWINGS

FIG. 11 is a timing diagram illustrating a case where a memory read is performed in the known multiprocessor structure shown in FIG. 10.

FIG. 12 is a timing diagram illustrating a case where a memory write is performed in the known multiprocessor structure shown in FIG. 10.

DESCRIPTION OF THE PREFERRED EMBODIMENTS

Hereinafter, embodiments of the present invention will be described with reference to the accompanying drawings.

Embodiment 1

Figure 1:
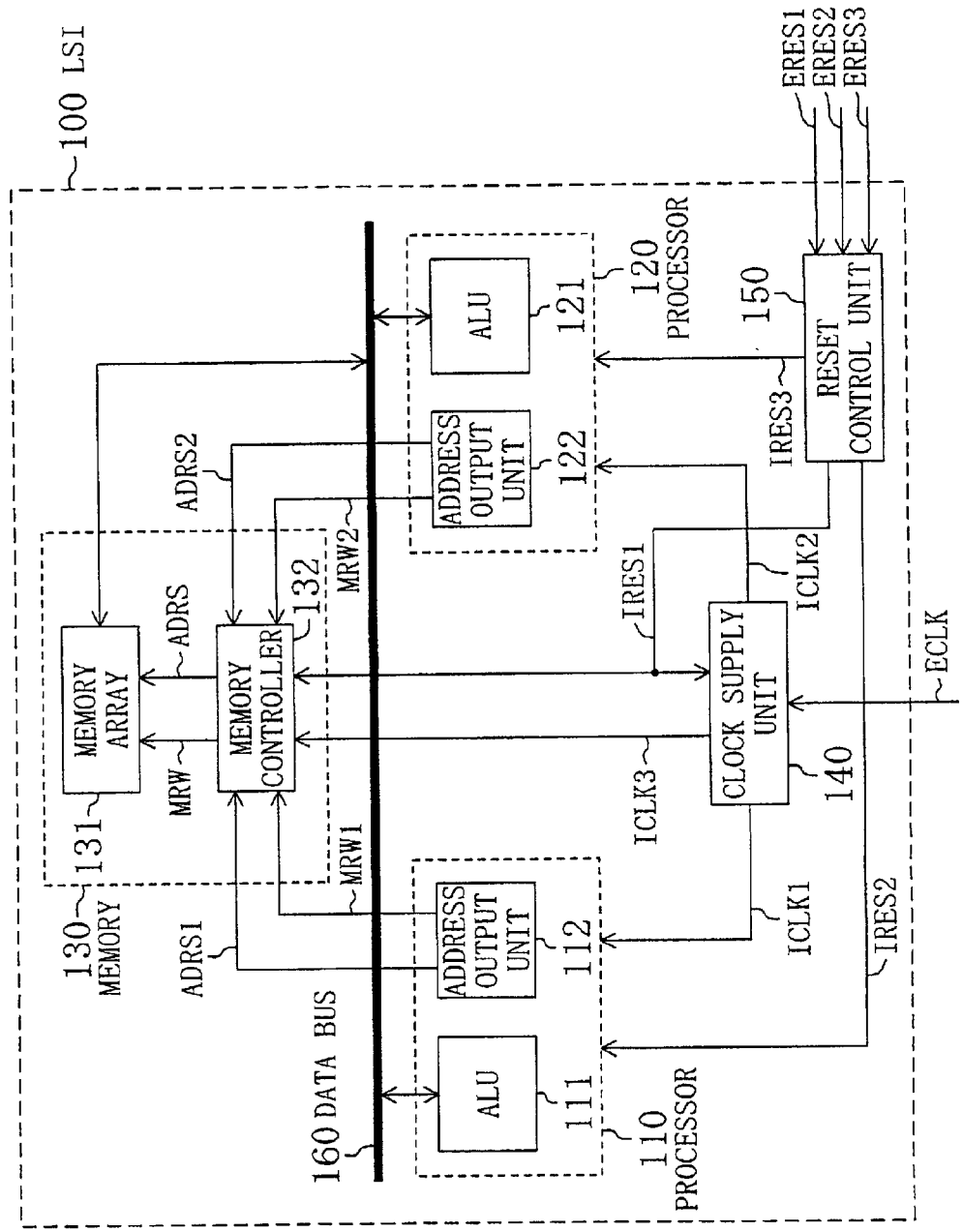
FIG. 1 is a block diagram illustrating a configuration for an LSI in accordance with a first embodiment of the present invention.

FIG. 1 illustrates a configuration for an LSI in accordance with a first embodiment of the present invention. An LSI 100 shown in FIG. 1 includes first processor 110, second processor 120, memory 130, clock supply unit 140, and reset control unit 150 that are integrated together on a single chip. The first processor 110 includes an arithmetic and logic unit (ALU) 111 and an address output unit 112, and operates synchronously with a first internal clock signal ICLK1. Similarly, the second processor 120 includes an arithmetic and logic unit (ALU) 121 and an address output unit 122, and operates synchronously with a second internal clock signal ICLK2. The first and second processors 110 and 120 are coupled to a memory 130 via a data bus 160. The memory 130 includes a memory array 131 and a memory controller 132, and operates synchronously with a third internal clock signal ICLK3.

Figure 2:
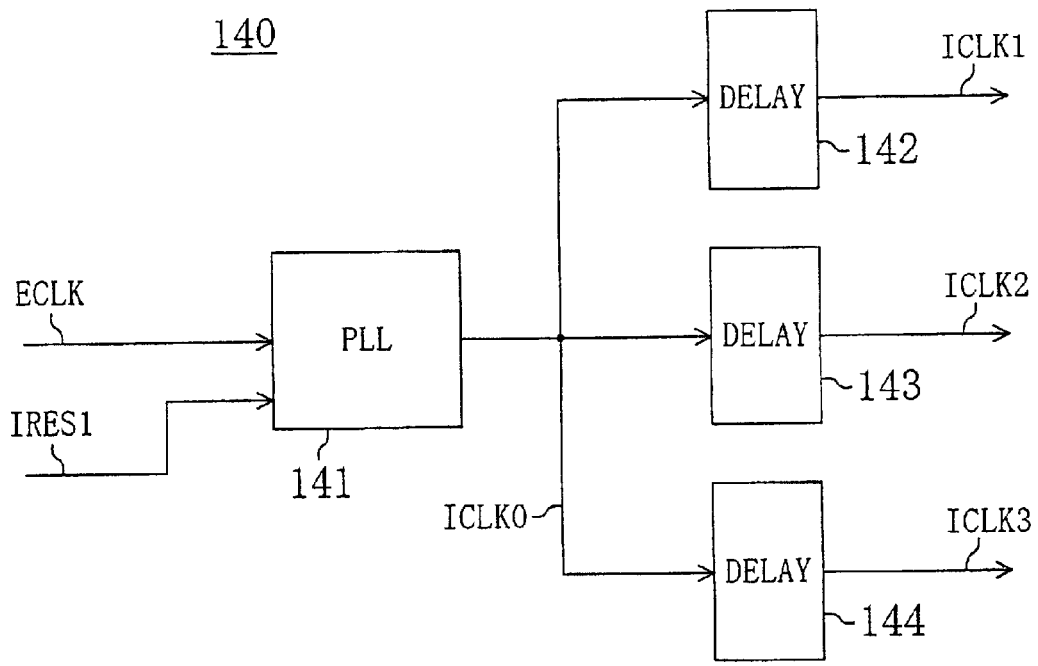
FIG. 2 illustrates an exemplary configuration for the clock supply unit shown in FIG. 1.

FIG. 2 illustrates an exemplary configuration for the clock supply unit 140. The clock supply unit 140 shown in FIG. 2 generates three clock signals, which are in phase with each other, from an external clock signal ECLK and supplies those clock signals as the internal clock signals ICLK1, ICKL2 and ICLK3. The clock supply unit 140 includes a PLL (phase-locked loop) 141 and three delay adjusting cells 142, 143 and 144. The PLL 141 receives the external clock signal ECLK and outputs an intermediate clock signal ICLK0. The delay adjusting cells 142, 143 and 144 adjust respective delays in ICLK1, ICKL2 and ICLK3 so that ICLK1, ICKL2 and ICLK3 are in phase with each other.

Figure 3:
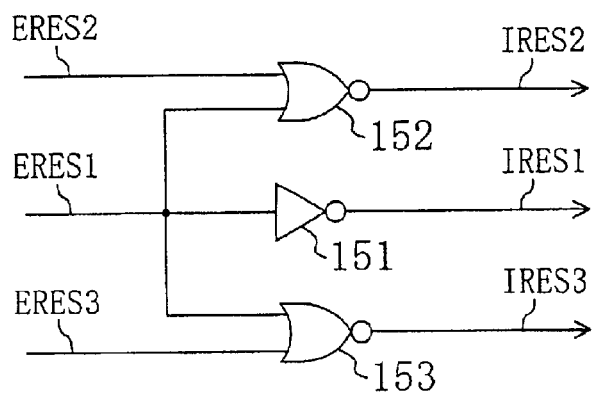
FIG. 3 illustrates an exemplary configuration for the reset control unit shown in FIG. 1.

FIG. 3 illustrates an exemplary configuration for the reset control unit 150. The reset control unit 150 shown in FIG. 3 receives first, second and third external reset signals ERES1, ERES2 and ERES3 and supplies first, second and third internal reset signals IRES1, IRES2 and IRES3. The first internal reset signal IRES1 resets the memory 130 and clock supply unit 140. The second internal reset signal IRES2 resets the first processor 110. The third internal reset signal IRES3 resets the second processor 120. The reset control unit 150 includes an inverter 151 and two NOR gates 152 and 153. In the reset control unit 150, when ERES1 is asserted (positive logic), IRES1, IRES2 and IRES3 are all asserted (negative logic). In this case, ERES2 and ERES3 may be in any logical state. If ERES2 is asserted while ERES1 is negated, only IRES2 is asserted. If ERES3 is asserted while ERES1 is negated, only IRES3 is asserted.

Figure 4:
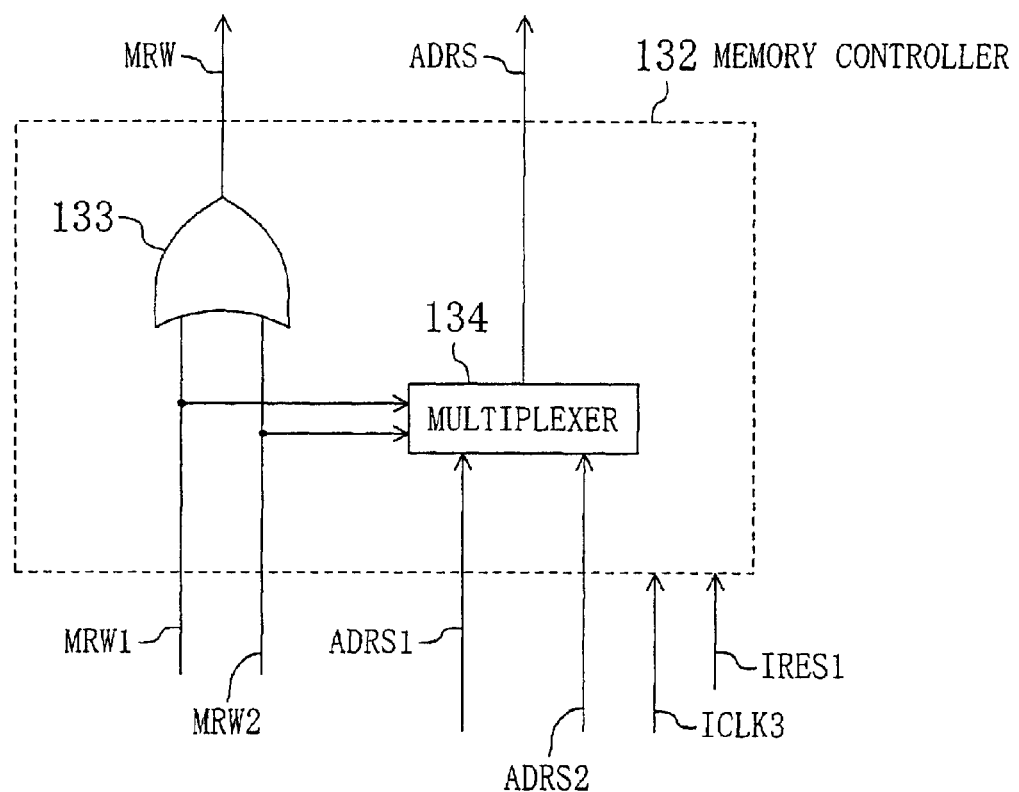
FIG. 4 illustrates an exemplary configuration for the memory controller shown in FIG. 1.

FIG. 4 illustrates an exemplary configuration for the memory controller 132. The memory controller 132 shown in FIG. 4 includes an OR gate 133 and a multiplexer 134, and receives first memory access signal MRW1, first address ADRS1, second memory access signal MRW2 and second address ADRS2. The first memory access signal MRW1 and first address ADRS1 are output from the address output unit 112 of the first processor 110. The second memory access signal MRW2 and second address ADRS2 are output from the address output unit 122 of the second processor 120. When MRW1 is asserted, the memory controller 132 selects and supplies ADRS1 to the memory array 131. When MRW2 is asserted, the memory controller 132 selects and supplies ADRS2 to the memory array 131. MRW and ADRS are a memory access signal and an address, respectively, both of which are supplied to the memory array 131.

To reset the whole LSI 100 shown in FIG. 1, ERES1 is asserted, thereby asserting all of the internal reset signals IRES1, IRES2 and IRES3. In this manner, all of the first and second processors 110 and 120, memory 130 and clock supply unit 140 are reset at the same time. Then, an external clock signal ECLK is provided to the LSI 100.

Next, when ERES1 is negated, the first and second processors 110 and 120, memory 130 and clock supply unit 140 start their predetermined operations. In this case, the clock supply unit 140 supplies ICLK1, ICLK2 and ICLK3 which are in phase with each other. Thus, the first and second processors 110 and 120 and memory 130 operate synchronously with each other.

Hereinafter, it will be described how the first processor 110 accesses the memory 130 after the reset operation has been performed.

Figure 5:
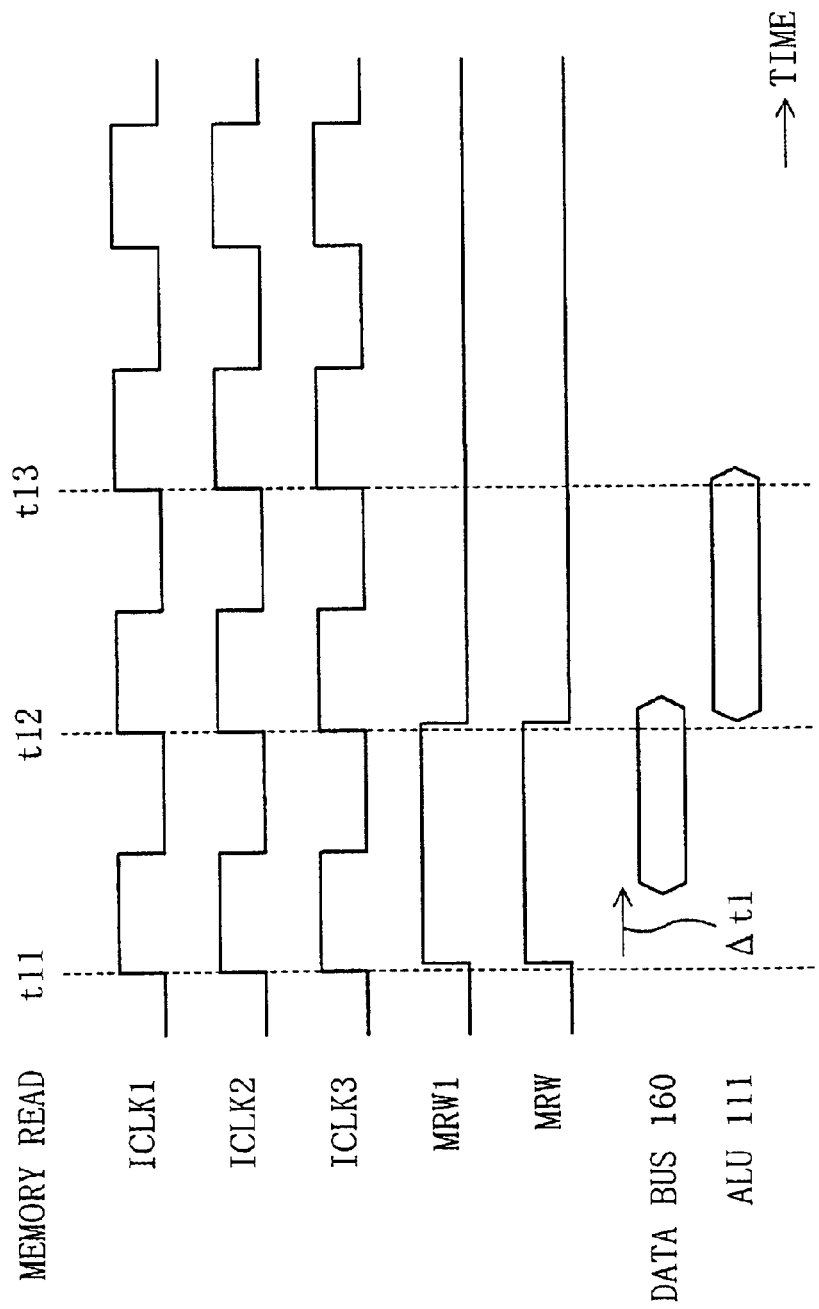
FIG. 5 is a timing diagram illustrating a case where a memory read is performed in the LSI shown in FIG. 1.

FIG. 5 is a timing diagram illustrating a case where the processor 110 reads data from the memory 130. At a time t11, the processor 110 asserts MRW1 so as to indicate a read-state and outputs ADRS1. Since MRW1 is asserted, the memory controller 132 selects ADRS1 by the multiplexer 134, and provides MRW and ADRS to the memory array 131 at the time t11. The memory array 131 outputs data to the data bus 160 after a memory access time Δt1 has passed. The arithmetic and logic unit (ALU) 111 of the processor 110 receives the data from the data bus 160 at a time t12 and completes computations before a time t13. This is to say, the processor 110 can complete the memory read in one cycle of ICLK1 (from the time t11 to the time t12).

Figure 6:
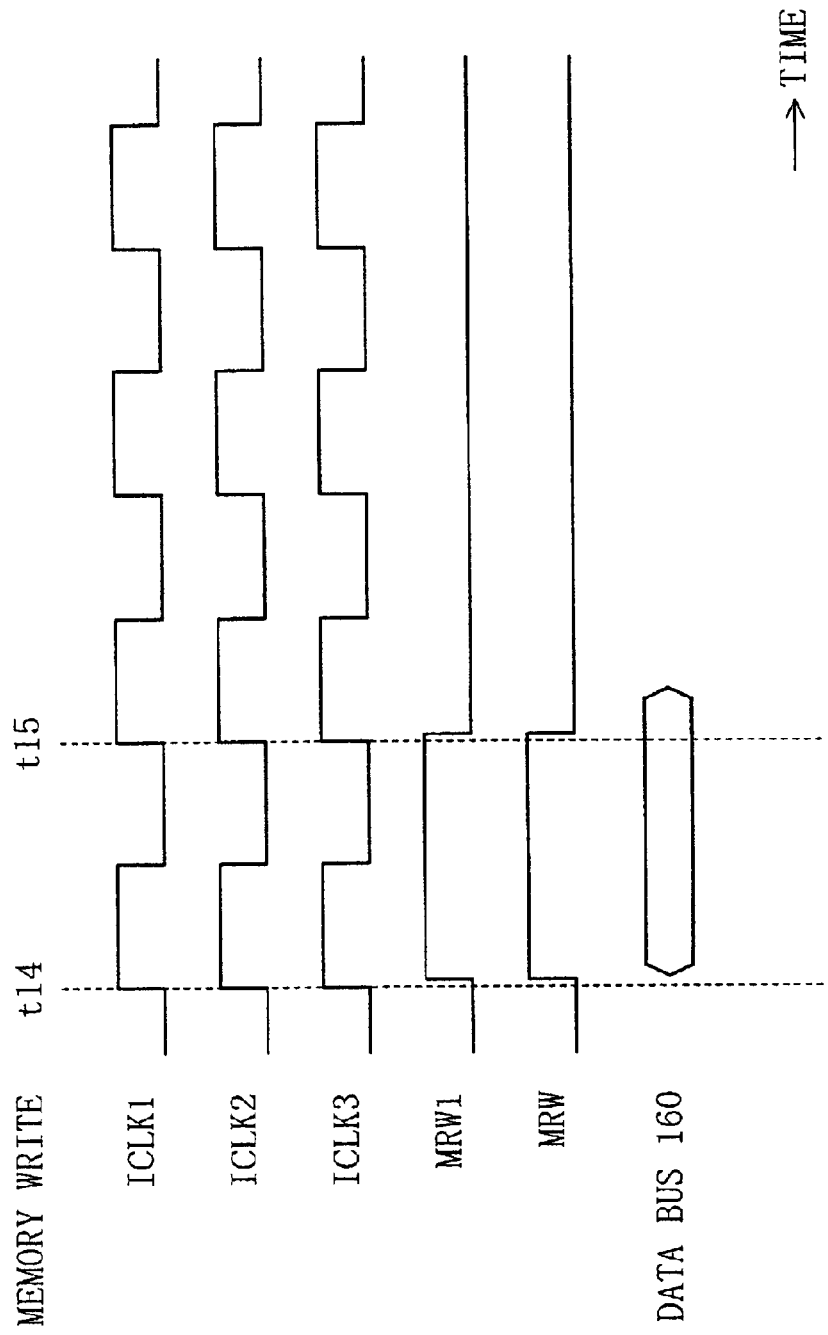
FIG. 6 is a timing diagram illustrating a case where a memory write is performed in the LSI shown in FIG. 1.

FIG. 6 is a timing diagram illustrating a case where the processor 110 writes data on the memory 130. At a time t14, the processor 110 asserts MRW1 so as to indicate a write-state and outputs ADRS1 and data to the memory controller 132 and the data bus 160, respectively. Since MRW1 is asserted, the memory controller 132 selects ADRS1 by the multiplexer 134, and supplies MRW and ADRS to the memory array 131 at the time t14. The memory array 131 receives the data from the data bus 160 at a time t15. This is to say, the processor 110 can complete the memory write in one cycle of ICLK1 (from the time t14 to the time t15).

Where the second processor 120 reads or writes data from/on the memory 130, MRW2 is asserted and the memory controller 132 selects ADRS2. In the other respects, the same operations are performed.

Where one of the processors 110 and 120 has completed its processing or where it is needed to have one of the processors 110 and 120 restart its processing from the beginning, ERES2 or ERES3 may be asserted. For example, where the second processor 120 has completed its processing, ERES3 may be asserted. In this case, since the reset control unit 150 asserts only IRES3, only the second processor 120 is reset. This is to say, the first processor 110, memory 130 and clock supply unit 140 continue their operations without being suspended.

Figure 10:
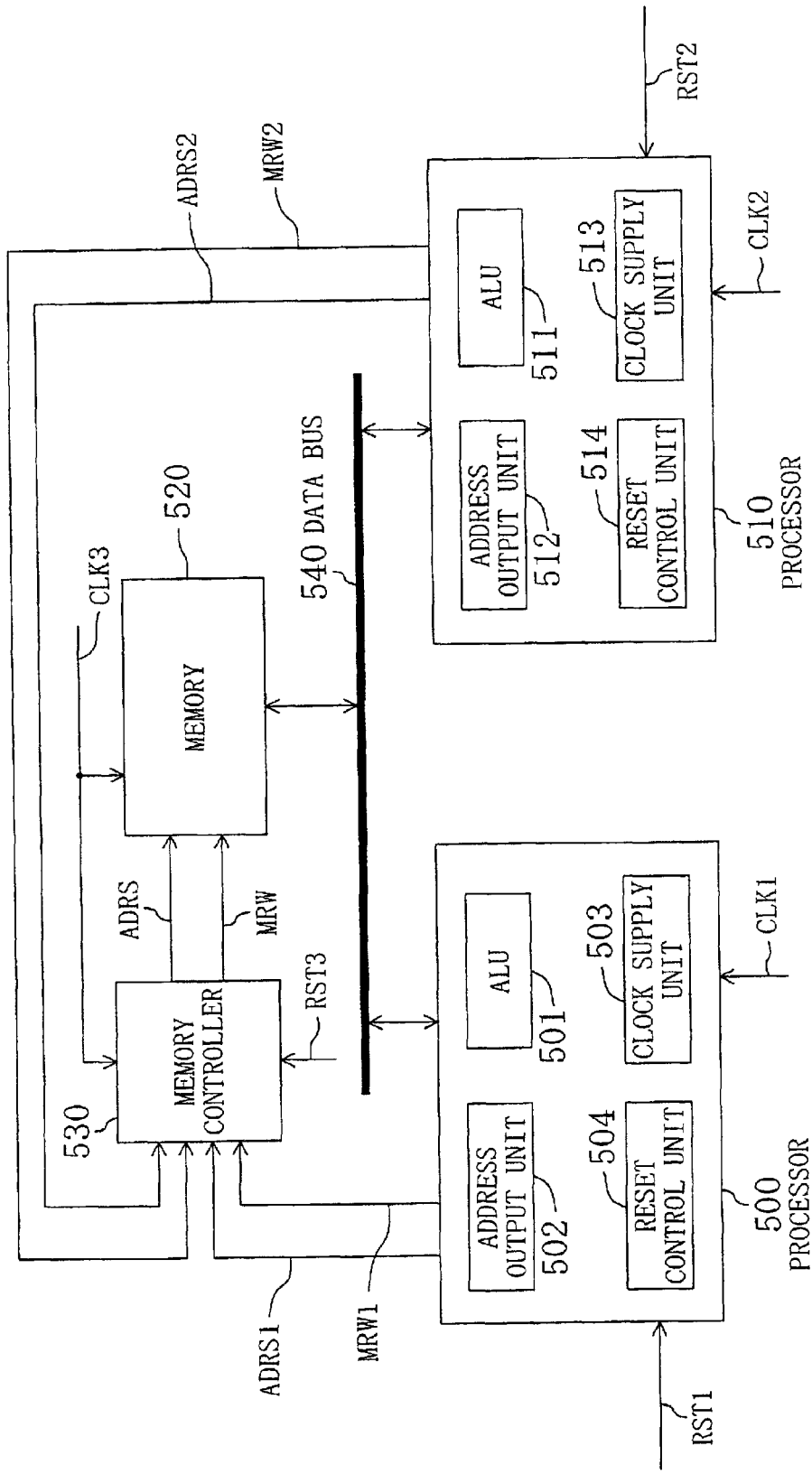
FIG. 10 is a block diagram illustrating an example of a known multiprocessor structure.

As described above, according to this embodiment, the clock supply unit 140 supplies ICLK1, ICLK2 and ICLK3 that are in phase with each other. The first and second processors 110 and 120 and memory 130 operate synchronously with ICLK1, ICLK2 and ICLK3, respectively. Thus, the memory controller 132 needs no specially provided circuit for the synchronization and the processors 110 and 120 can access the memory 130 at a high speed. Also, the LSI 100 includes only one built-in clock supply unit 140 and one built-in reset control unit 150. Thus, the total chip area can be reduced drastically as compared to the example shown in FIG. 10, in which each of the processors includes these units. In addition, ERES1, ERES2 and ERES3 may be provided to the LSI 100 by taking only the phase of the single external clock signal ECLK into account. Thus, it will be easier to design the input timing of the external reset signals.

Figure 7:
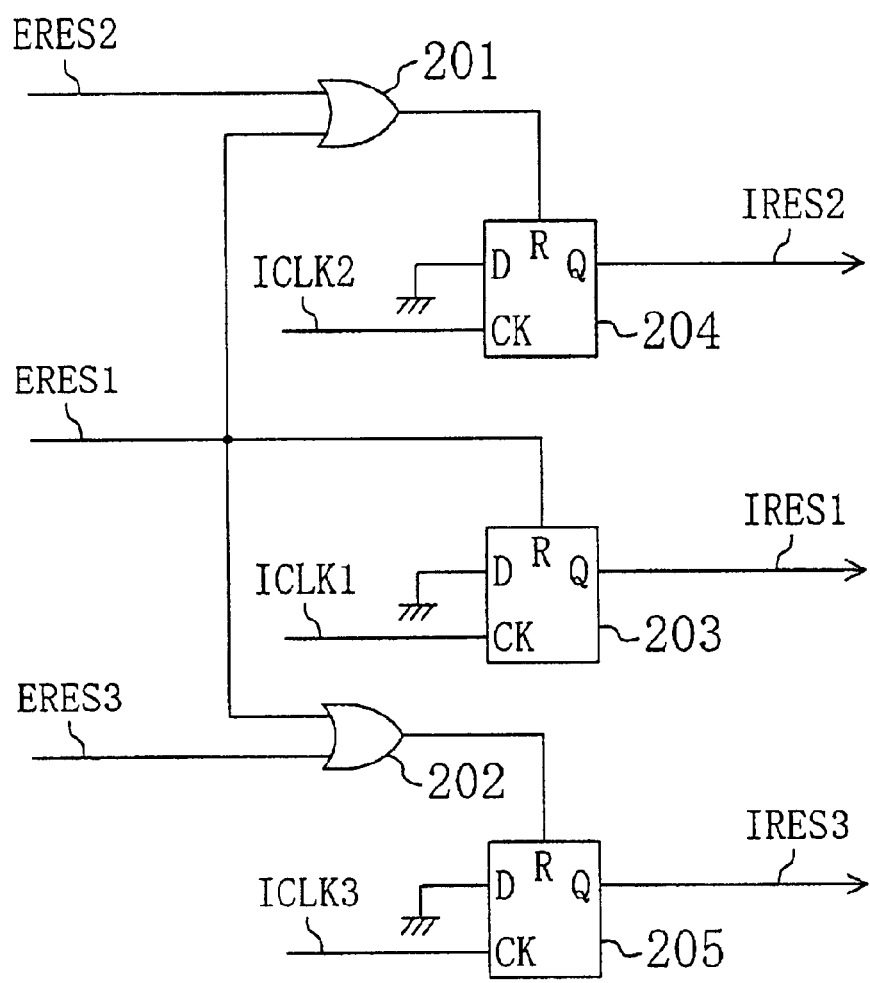
FIG. 7 illustrates a modified example of the reset control unit shown in FIG. 1.

FIG. 7 illustrates a modified example of the reset control unit 150. The reset control unit 150 shown in FIG. 7 includes two OR gates 201 and 202 and first, second and third flip-flops (FF) 203, 204 and 205. The first FF 203, which is used to supply IRES1, is connected to ICLK1. The second FF 204, which is used to supply IRES2, is connected to ICLK2. The third FF 205, which is used to supply IRES3, is connected to ICLK3. In the reset control unit 150, when ERES1 is asserted (positive logic), IRES1, IRES2 and IRES3 are all asserted (negative logic). In addition, IRES1, IRES2 and IRES3 can be negated at the same time by ICLK1, ICLK2 and ICLK3 that are in phase with each other. If ERES2 is asserted while ERES1 is negated, only IRES2 is asserted. If ERES3 is asserted while ERES1 is negated, only IRES3 is asserted.

Embodiment 2

Figure 8:
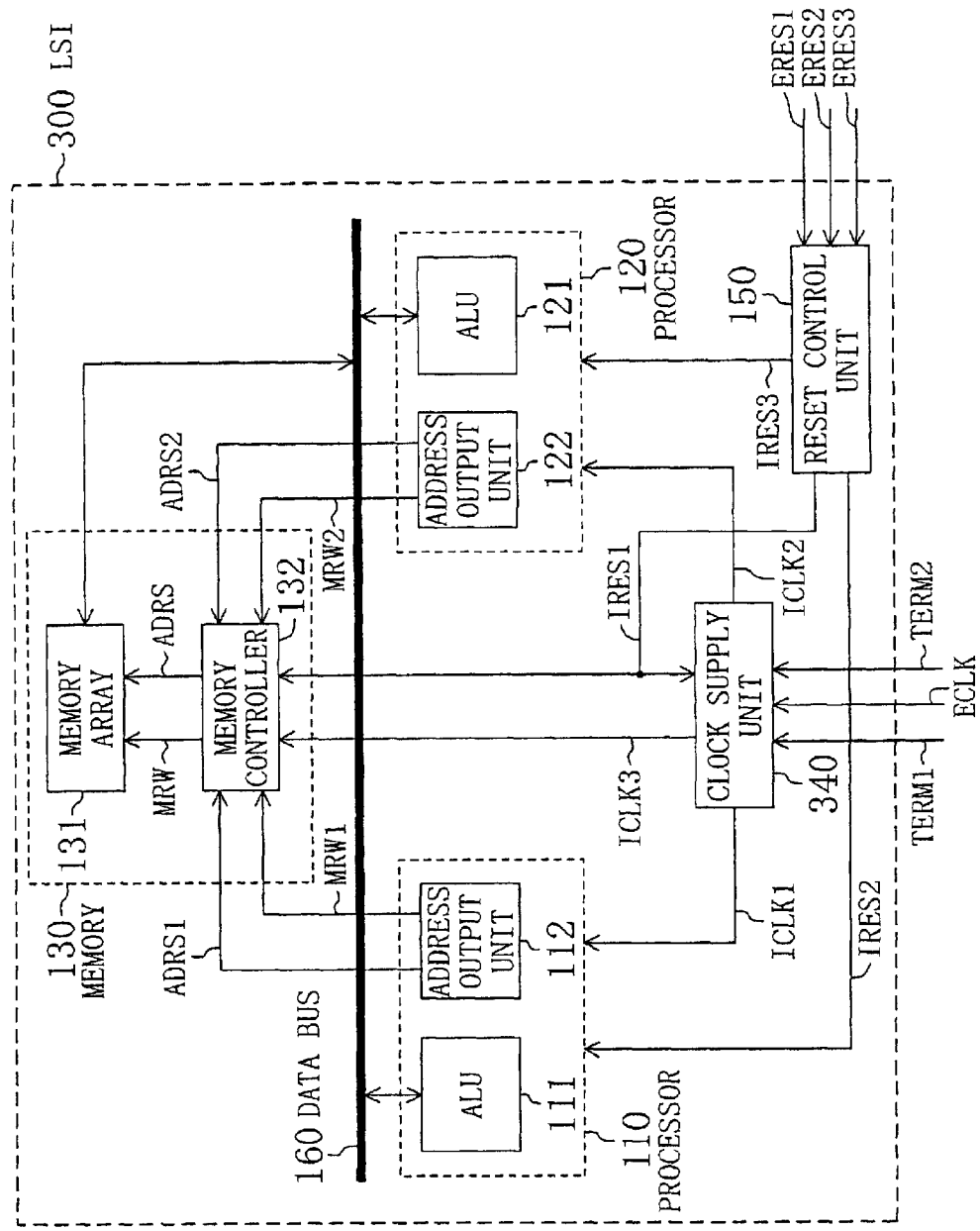
FIG. 8 is a block diagram illustrating a configuration for an LSI in accordance with a second embodiment of the present invention.

FIG. 8 illustrates a configuration for an LSI in accordance with a second embodiment of the present invention. The LSI 300 shown in FIG. 8 differs from the LSI 100 of the first embodiment in that a clock supply unit 340 receives a first terminating signal TERM1 and a second terminating signal TERM2.

Figure 9:
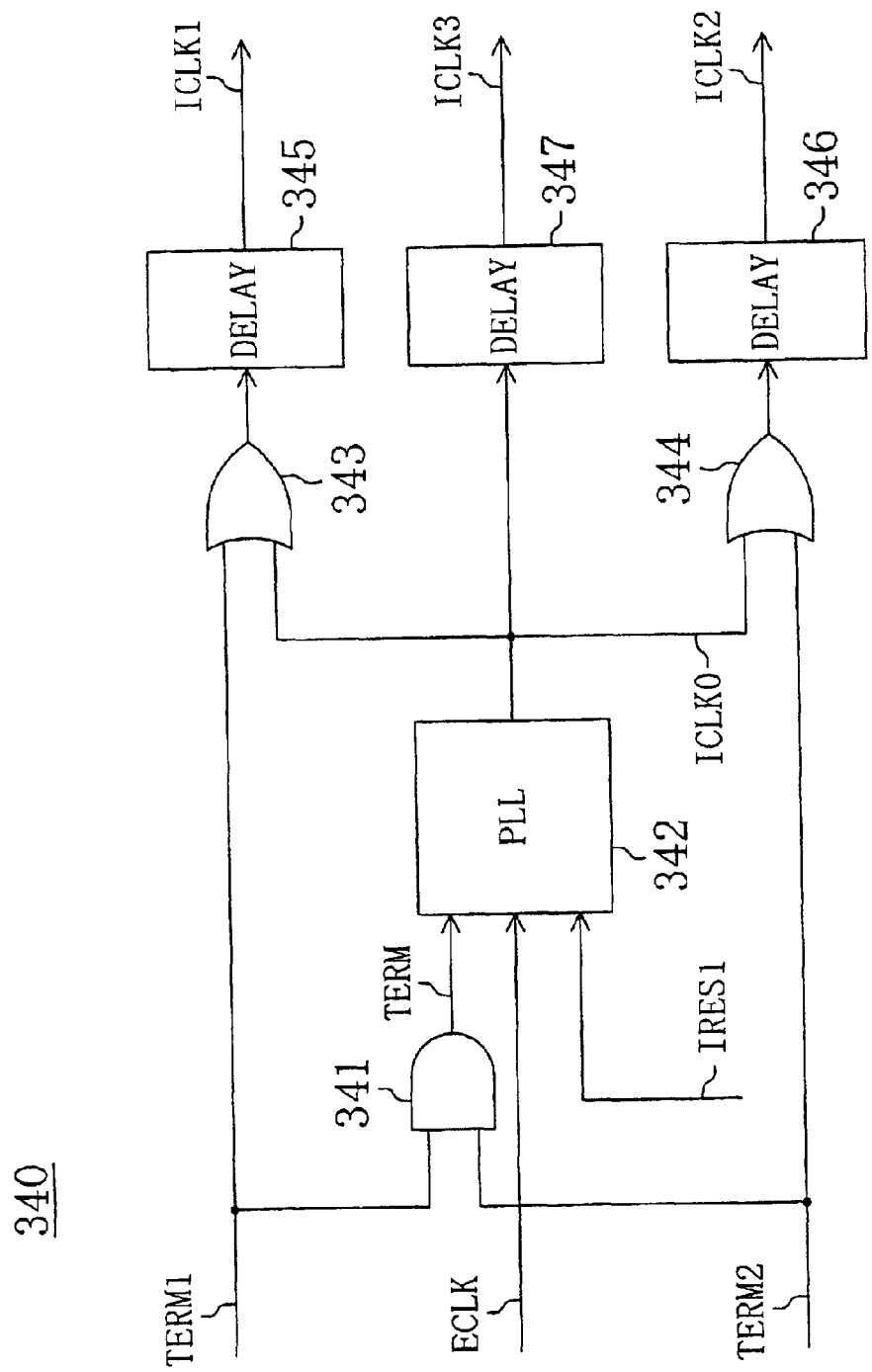
FIG. 9 illustrates an exemplary configuration for the clock supply unit shown in FIG. 8.

FIG. 9 illustrates an exemplary configuration for the clock supply unit 340. The clock supply unit 340 shown in FIG. 9 is basically similar to the clock supply unit 140 shown in FIG. 2, i.e., generates three clock signals, which are in phase with each other, from an external clock signal ECLK and supplies those clock signals as internal clock signals ICLK1, ICKL2 and ICLK3. The clock supply unit 340 includes an AND gate 341, a PLL 342, two OR gates 343 and 344, and three delay adjusting cells 345, 346 and 347. The PLL 342 receives the external clock signal ECLK and outputs an intermediate clock signal ICLK0. The delay adjusting cells 345, 346 and 347 adjust respective delays in ICKL1, ICLK2 and ICLK3 so that ICKL1, ICLK2 are ICLK3 are in phase with each other. Besides, when only TERM1 is asserted (positive logic), the OR gate 343 masks ICLK0. As a result, only the supply of ICLK1 is stopped. Also, when only TERM2 is asserted (positive logic), the OR gate 344 masks ICLK0. As a result, only the supply of ICLK2 is stopped. Moreover, where TERM1 and TERM2 are asserted at the same time, an output TERM from the AND gate 341 is asserted and the PLL 342 stops supplying ILCK0. As a result, the supply of ICLK1, ICLK2 and ICLK3 is all stopped.

According to this embodiment, where at least one of the processors 110 and 120 has completed its processing, any of the internal clock signals ICLK1, ICLK2 and ICLK3 will be terminated when unnecessary. Thus, power dissipation of the LSI 300 can be reduced. For example, where the second processor 120 has completed its processing, TERM2 is asserted. Then, the clock supply unit 340 responds by stopping the supply of ICLK2. In this case, the supply of ILCK1 and ICLK3 is not stopped, thus allowing the first processor 110 to keep accessing the memory 130 and also continue its processing without being suspended.

In the foregoing embodiments, the LSIs 100 and 300, each of which has two built-in processors and a built-in memory, have been described. However, the present invention may also be applicable to an LSI including three or more processors. In that case, the memory controller 132 may receive and select three or more pairs of a memory access signal and an address. Also where an LSI includes two or more memory arrays, a unit which is equivalent to the memory controller 132 may be connected to each of the memory arrays.

What is claimed is:

1. An integrated circuit having a multiprocessor architecture, the circuit comprising:

a first processor, which operates synchronously with a first internal clock signal;

a second processor, which operates synchronously with a second internal clock signal;

a memory, which operates synchronously with a third internal clock signal; and a clock supply unit, which respectively adjusts the delays of three clock signal generated from an external clock signal and respectively supplies the three clock signals as the first, the second and the third internal clock signals, such that the first, the second and the third internal clock signals are in phase with each other;

wherein the first processor, the second processor, the memory, and the clock supply unit are integrated together on a single chip, wherein the clock supply unit further, receives a first terminating signal and a second terminating signal;

stops supplying all of the first, second and third internal clock signals when the first and second terminating signals are asserted at the same time;

stops supplying only the first internal clock signal when the first terminating signal is solely asserted; and stops supplying only the second internal clock signal when the second terminating signal is solely asserted.

2. An integrated circuit having a multiprocessor architecture, the circuit comprising:
- a first processor, which operates synchronously with a first internal clock signal;
- a second processor, which operates synchronously with a second internal clock signal;
- a memory, which operates synchronously with a third internal clock signal; and
- a clock supply unit, which respectively adjusts the delays of three clock signals generated from an external clock signal and respectively supplies the three clock signals as the first, the second and the third internal clock signals, such that the first, the second and the third internal clock signals are in phase with each other;
- wherein the first processor, the second processor, the memory, and the clock supply unit are integrated together on a single chip,
- wherein the integrated circuit further comprises a reset control unit that is integrated on the chip, the reset control unit supplying a first internal reset signal, a second internal reset signal and a third internal reset signal, the first internal reset signal being used for resetting the memory, the second internal reset signal being used for resetting the first processor, the third internal reset signal being used for resetting the second processor,
- wherein the reset control unit,
- receives a first external reset signal, a second external reset signal, and a third external reset signal;
- asserts all of the first, second and third internal reset signals when the first external reset signal is asserted;
- asserts only the second internal reset signal when the second external reset signal is asserted; and
- asserts only the third internal reset signal when the third external reset signal is asserted,
- wherein the clock supply unit further,
- receives a first terminating signal and a second terminating signal;
- stops supplying all of the first, second and third internal clock signals when the first and second terminating signals are asserted at the same time;
- stops supplying only the first internal clock signal when the first terminating signal is solely asserted; and
- stops supplying only the second internal clock signal when the second terminating signal is solely asserted.

3. An integrated circuit having a multiprocessor architecture, the circuit comprising:
- a first processor, which operates synchronously with a first internal clock signal;
- a second processor, which operates synchronously with a second internal clock signal;
- a memory, which operates synchronously with a third internal clock signal; and
- a clock supply unit, which respectively supplies three clock signals generated from an external clock signal as the first, the second and the third internal clock signals, wherein
- the first processor, the second processor, the memory, and the clock supply unit are integrated together on a single chip, and
- the clock supply unit,
- receives a first terminating signal and a second terminating signal;
- stops supplying all of the first, second and third internal clock signals when the first and second terminating signals are asserted at the same time;
- stops supplying only the first internal clock signal of the first, second and third internal clock signals when only the first terminating signal of the first and second terminating signals is asserted; and
- stops supplying only the second internal clock signal of the first, second and third internal clock signals when only the second terminating signal of the first and second terminating signals is asserted.

* * * * *